United States Patent
Jones et al.

(10) Patent No.: US 7,412,552 B2
(45) Date of Patent: Aug. 12, 2008

(54) FLASHTOASTER FOR READING SEVERAL TYPES OF FLASH-MEMORY CARDS, WITH OR WITHOUT A PC

(75) Inventors: Larry Lawson Jones, Palo Alto, CA (US); Sreenath Mambakkam, San Jose, CA (US); Arockiyaswamy Venkidu, Menlo Park, CA (US)

(73) Assignee: MCM Portfolio LLC, Cupertino, CA (US)

( * ) Notice: Subject to any disclaimer, the term of this patent is extended or adjusted under 35 U.S.C. 154(b) by 0 days.

(21) Appl. No.: 11/671,410

(22) Filed: Feb. 5, 2007

(65) Prior Publication Data

US 2007/0283069 A1 Dec. 6, 2007

Related U.S. Application Data

(63) Continuation of application No. 10/167,925, filed on Jun. 11, 2002, now Pat. No. 7,222,205, which is a continuation of application No. 09/610,904, filed on Jul. 6, 2000, now Pat. No. 6,438,638.

(51) Int. Cl.
*G06F 13/00* (2006.01)
*H05K 7/10* (2006.01)

(52) U.S. Cl. ..................................... 710/301
(58) Field of Classification Search ................ 710/301
See application file for complete search history.

(56) References Cited

U.S. PATENT DOCUMENTS 4,092,732 A 5/1978 Ouchi (Continued)

FOREIGN PATENT DOCUMENTS

DE 20109810 8/2001

(Continued)

OTHER PUBLICATIONS

Jones, Larry Lawson et al., U.S. Appl. No. 11/003,185 entitled "Flashtoaster for Reading Several Types of Flash Memory Cards with or without a PC," filed Dec. 2, 2004.

(Continued)

*Primary Examiner*—Paul R. Myers
*Assistant Examiner*—Ryan M Stiglic
(74) *Attorney, Agent, or Firm*—John P. Ward; Greenberg Traurig, LLP

(57) ABSTRACT

A flash-memory-card reader reads and writes multiple types of flash-memory cards, including CompactFlash, and the smaller SmartMedia, MultiMediaCard, Secure Digital, and Memory Stick. A converter chip converts the different card signals for transfer to a host personal computer (PC). Serial-to-parallel data conversion is performed for the smaller card formats with serial data interfaces, but not for CompactFlash with a parallel-data interface. A signal slot has a 50-pin connector for CompactFlash cards or passive adapters. The passive adapters have the CompactFlash form factor and a smaller connector fitting smaller flash cards. Passive adapters have no components but simply wire the smaller connector to the CompactFlash connector. A pin mapping allows card-type detection by sensing the LSB address pins of the CompactFlash interface. A larger CompactFlash reader has multiple slots for each card type. The reader is connected to the PC by a cable, or located within the PC chassis in a drive bay. A stand-alone reader copies images from the flash-memory card to a removable disk media. Pressing a button initiates image transfer.

21 Claims, 11 Drawing Sheets

U.S. PATENT DOCUMENTS

| | | | |
|---|---|---|---|
| 5,296,692 A | 3/1994 | Shino | |
| 5,394,206 A | 2/1995 | Cocca | |
| 5,396,617 A | 3/1995 | Villwock et al. | |
| 5,436,621 A | 7/1995 | Macko et al. | |
| 5,437,020 A | 7/1995 | Wells et al. | |
| 5,471,038 A | 11/1995 | Eisele et al. | |
| 5,485,606 A | 1/1996 | Midgdey | |
| 5,497,464 A | 3/1996 | Yeh | |
| 5,522,049 A | 5/1996 | Kimura et al. | |
| 5,538,436 A | 7/1996 | Garney | |
| 5,576,698 A | 11/1996 | Card et al. | |
| 5,584,043 A | 12/1996 | Burkart | |
| 5,589,719 A | 12/1996 | Fiset | |
| 5,596,562 A | 1/1997 | Chen | |
| 5,604,917 A | 2/1997 | Saito et al. | |
| 5,630,174 A | 5/1997 | Stone et al. | |
| 5,640,541 A | 6/1997 | Bartram et al. | |
| 5,679,007 A | 10/1997 | Potdevin et al. | |
| 5,708,799 A * | 1/1998 | Gafken et al. | 710/301 |
| 5,717,951 A | 2/1998 | Yabumoto | |
| 5,729,204 A | 3/1998 | Fackler et al. | |
| 5,734,894 A | 3/1998 | Adamson et al. | |
| 5,740,349 A | 4/1998 | Hasbun et al. | |
| 5,752,857 A | 5/1998 | Knights | |
| 5,786,769 A | 7/1998 | Coteus et al. | |
| 5,790,878 A | 8/1998 | Anderson et al. | |
| 5,802,553 A | 9/1998 | Robinson et al. | |
| 5,805,834 A | 9/1998 | McKinley et al. | |
| 5,815,426 A | 9/1998 | Jigour et al. | |
| 5,828,905 A | 10/1998 | Rao | |
| 5,844,910 A | 12/1998 | Niijima et al. | |
| 5,844,911 A | 12/1998 | Schadegg et al. | |
| 5,877,975 A | 3/1999 | Jigour et al. | |
| 5,887,145 A | 3/1999 | Harari et al. | |
| 5,892,213 A | 4/1999 | Ito | |
| 5,905,888 A | 5/1999 | Jones et al. | |
| 5,928,347 A | 7/1999 | Jones | |
| 5,928,370 A | 7/1999 | Asnaashari | |
| 5,929,416 A | 7/1999 | Dos Santos Pato et al. | |
| 5,930,496 A | 7/1999 | MacLaren et al. | |
| 5,933,328 A | 8/1999 | Wallace et al. | |
| 5,956,473 A | 9/1999 | Ma et al. | |
| 5,961,652 A | 10/1999 | Thompson | |
| 5,964,885 A | 10/1999 | Little et al. | |
| 5,974,426 A | 10/1999 | Lee et al. | |
| D416,541 S | 11/1999 | Hirai et al. | |
| 5,995,376 A | 11/1999 | Schultz et al. | |
| 6,002,605 A | 12/1999 | Iwasaki et al. | |
| 6,006,295 A | 12/1999 | Jones et al. | |
| 6,009,492 A | 12/1999 | Matsuoka | |
| 6,010,066 A | 1/2000 | Itou et al. | |
| 6,011,741 A | 1/2000 | Wallace et al. | |
| 6,015,093 A | 1/2000 | Barrett et al. | |
| 6,026,007 A | 2/2000 | Jigour et al. | |
| 6,038,400 A * | 3/2000 | Bell et al. | 710/11 |
| 6,061,746 A | 5/2000 | Stanley et al. | |
| 6,062,887 A | 5/2000 | Schuster et al. | |
| 6,067,234 A | 5/2000 | Kim et al. | |
| 6,075,706 A | 6/2000 | Learmonth et al. | |
| 6,079,621 A | 6/2000 | Vardanyan et al. | |
| 6,088,755 A | 7/2000 | Kobayashi et al. | |
| 6,088,802 A | 7/2000 | Bialick et al. | |
| 6,097,605 A | 8/2000 | Klatt et al. | |
| 6,102,715 A | 8/2000 | Centofante | |
| 6,112,014 A | 8/2000 | Kane | |
| 6,132,223 A | 10/2000 | Seeley et al. | |
| 6,137,710 A | 10/2000 | Iwasaki et al. | |
| 6,145,046 A | 11/2000 | Jones | |
| 6,170,029 B1 | 1/2001 | Kelley et al. | |
| 6,170,066 B1 | 1/2001 | See | |
| 6,173,291 B1 | 1/2001 | Jenevein | |
| 6,175,517 B1 | 1/2001 | Jigour et al. | |
| 6,182,162 B1 | 1/2001 | Estakhri et al. | |
| 6,189,055 B1 | 2/2001 | Eisele et al. | |
| 6,199,122 B1 | 3/2001 | Kobayashi | |
| 6,202,932 B1 | 3/2001 | Rapeli | |
| 6,203,378 B1 | 3/2001 | Shobara et al. | |
| 6,226,202 B1 | 5/2001 | Kikuchi | |
| 6,264,506 B1 | 7/2001 | Yasufuku et al. | |
| 6,266,724 B1 | 7/2001 | Harari et al. | |
| 6,279,069 B1 | 8/2001 | Robinson et al. | |
| 6,282,612 B1 | 8/2001 | Sakajiri et al. | |
| 6,292,863 B1 | 9/2001 | Terasaki et al. | |
| 6,317,352 B1 | 11/2001 | Halbert et al. | |
| 6,330,688 B1 | 12/2001 | Brown | |
| 6,353,870 B1 | 3/2002 | Mills et al. | |
| 6,381,662 B1 | 4/2002 | Harari et al. | |
| 6,385,677 B1 | 5/2002 | Yao | |
| 6,386,920 B1 | 5/2002 | Sun | |
| 6,402,558 B1 | 6/2002 | Hung-Ju et al. | |
| 6,405,323 B1 | 6/2002 | Lin et al. | |
| 6,408,352 B1 | 6/2002 | Hosaka et al. | |
| 6,413,108 B2 | 7/2002 | Centofante | |
| 6,426,801 B1 | 7/2002 | Reed | |
| 6,438,638 B1 * | 8/2002 | Jones et al. | 710/301 |
| 6,468,101 B2 | 10/2002 | Suzuki | |
| 6,470,284 B1 | 10/2002 | Oh et al. | |
| 6,482,029 B2 | 11/2002 | Nishimura | |
| 6,490,163 B1 | 12/2002 | Pua et al. | |
| 6,578,125 B2 | 6/2003 | Toba | |
| 6,581,830 B1 | 6/2003 | Jelinek et al. | |
| 6,599,147 B1 | 7/2003 | Mills et al. | |
| 6,601,124 B1 | 7/2003 | Blair | |
| 6,607,405 B2 | 8/2003 | Nishimura | |
| 6,658,202 B1 | 12/2003 | Battaglia et al. | |
| 6,658,516 B2 | 12/2003 | Yao | |
| 6,663,007 B1 | 12/2003 | Sun | |
| 6,666,724 B1 | 12/2003 | Lwee | |
| 6,675,233 B1 | 1/2004 | Du et al. | |
| 6,684,283 B1 | 1/2004 | Harris et al. | |
| 6,705,529 B1 | 3/2004 | Kettunen et al. | |
| 6,718,274 B2 | 4/2004 | Huang et al. | |
| 6,738,259 B2 | 5/2004 | Le et al. | |
| 6,745,267 B2 | 6/2004 | Chen et al. | |
| 6,746,280 B1 | 6/2004 | Lu et al. | |
| 6,751,694 B2 | 6/2004 | Liu et al. | |
| 6,761,313 B2 | 7/2004 | Hsieh et al. | |
| 6,761,320 B1 | 7/2004 | Chen | |
| 6,808,424 B2 | 10/2004 | Kaneshiro et al. | |
| 6,832,281 B2 * | 12/2004 | Jones et al. | 710/301 |
| 6,839,864 B2 | 1/2005 | Mambakkam et al. | |
| 6,859,369 B2 | 2/2005 | Mambakkam et al. | |
| 6,973,535 B2 | 12/2005 | Bruner et al. | |
| 7,062,584 B1 | 6/2006 | Worrell et al. | |
| 7,065,591 B2 | 6/2006 | Han et al. | |
| 7,093,161 B1 | 8/2006 | Mambakkam et al. | |
| 7,095,618 B1 | 8/2006 | Jones et al. | |
| 7,162,547 B2 | 1/2007 | Hosaka et al. | |
| 7,191,270 B2 | 3/2007 | Oh et al. | |
| 7,222,205 B2 * | 5/2007 | Jones et al. | 710/301 |
| 7,252,240 B1 | 8/2007 | Jones et al. | |
| 7,278,051 B2 | 10/2007 | Mambakkam et al. | |
| 7,295,443 B2 | 11/2007 | Mambakkam et al. | |
| 2001/0039603 A1 | 11/2001 | Manowitz | |
| 2002/0069363 A1 | 6/2002 | Winburn | |
| 2002/0178307 A1 | 11/2002 | Pua et al. | |
| 2002/0185533 A1 | 12/2002 | Shieh et al. | |
| 2003/0038177 A1 | 2/2003 | Morrow | |
| 2003/0041203 A1 * | 2/2003 | Jones et al. | 710/301 |
| 2003/0070112 A1 | 4/2003 | York | |
| 2003/0084220 A1 | 5/2003 | Jones et al. | |
| 2003/0084221 A1 * | 5/2003 | Jones et al. | 710/302 |
| 2003/0093606 A1 | 5/2003 | Mambakkam et al. | |
| 2004/0027879 A1 | 2/2004 | Chang | |

| | | | |
|---|---|---|---|
| 2006/0059385 | A1 | 3/2006 | Atri et al. |
| 2006/0242460 | A1 | 10/2006 | Mambakkam et al. |
| 2006/0253636 | A1 | 11/2006 | Jones et al. |
| 2007/0180177 | A1* | 8/2007 | Jones et al. ............... 710/301 |
| 2007/0283069 | A1* | 12/2007 | Jones et al. ............... 710/301 |
| 2007/0288677 | A1 | 12/2007 | Mambakkam et al. |
| 2008/0009196 | A1 | 1/2008 | Mambakkam et al. |
| 2008/0017718 | A1 | 1/2008 | Jones et al. |

FOREIGN PATENT DOCUMENTS

| | | |
|---|---|---|
| EP | 0775964 | 9/1996 |
| EP | 0987876 | 8/1997 |
| EP | 1043884 | 10/2000 |
| EP | 1139208 | 10/2001 |
| JP | 6195524 | 7/1994 |
| JP | 08235028 | 9/1996 |
| JP | 1115928 | 1/1999 |
| JP | 11053485 | 2/1999 |
| TW | 490889 | 6/2002 |
| WO | 0023936 | 4/2000 |
| WO | 2004027617 | 4/2004 |

OTHER PUBLICATIONS

Actiontec, "CameraConnect Pro," available at least by Oct. 28, 1999.
Actiontec, "CameraConnect Pro Parallel Port Flash Card Reader User's Manual," available at least by Oct. 28, 1999.
Antec, Inc., "PhotoChute3 USB," available at least by Apr. 26, 1999.
CompactFlash Association, "CF+ and Compact Flash Specification," Rev. 1.4, Jul. 1999.
DataFab Systems, Inc., "DataFab Systems Inc., Leading in Portable Storage Systems, Is Now Offering Dual-Slot CompactFlash and SmartMedia Card Reader," Sep. 10, 1999.
Twice.com, "Digital Imaging Well Exposed at RetailVision," available at least by Apr. 26, 1999.
Supplementary Search Report for EP Application No. 01952974.2, Sep. 21, 2004.
CQ Publishing of Japan, "Interface," pp. 52-131, Dec. 1, 1999.
Lexar Media Web Pages—Parallel Port, Universal Readers, FAQ, Jumpshot, Jun. 5, 2000.*
Microtech International, Inc., "Microtech Digital Photography Solutions," available at least by Feb. 26, 2000.
Microtech International, Inc., "PCD-47 User's Manual," Version 1.1, available at least by May 24, 2000.
Microtech International, Inc., "Microtech PCD-47B SCSI Digital Film Reader/Writer," available at least by May 24, 2000.
Microtech International, Inc., "Microtech Delivers Industry's First 3 Slot SCSI Digital Film Reader," Jan. 5, 2000.
Microtech International, Inc., "Microtech USB CameraMate Supports IBM Microdrive," Feb. 18, 1999.
Microtouch Smart Media to PCMCIA Adapter Product Sheet, Jun. 8, 2000.
Steve's Digicams, "Microtech USB CameraMate User Review," Sep. 5, 1999.
Steve's Digicams, "CardMate PCF-100 User Review," Apr. 12, 1999.
Burge, Legand L., et al., "A Ubiquitous Stable Storage for Mobile Computing Devices," ACM, Proceedings of the 2001 ACM Symposium on Applied Computing, pp. 401-404, Mar. 2001.
DataRescue sa/nv, Inc., "PhotoRescue User's Guide," rev. 1.0, pp. 1-8, 2001.
DataRescue sa/nv, Inc., DataRescue Home Page, located at http://web.archive.org/web/20010722191109/http://datarescue.com, archived Jul. 22, 2001.
DataRescue sa/nv, Inc., DataRescue PhotoRescue™ Specifications, located at http://web.archive.org/web/20010827073251/www.datarescue.com/photorescue/spec.htm, archived Aug. 27, 2001.
Galbraith, Rob, "Building the Ultimate Photo Recovery Kit," located at http://www.robgalbraith.com/bins/content_page.asp?cid=7-4419-4501, Jan. 23, 2002.
Ontrack Data International, Inc., "EasyRecovery™ Professional Edition User Guide," pp. 1-45, 2000.
Lexmark International, Inc., Service Manual for 5000 and 5700 Color Jetprinter & 5770 Photo Jetprinter, Oct. 2000.

* cited by examiner

HH = CF

| Pin | CF | Smart Media | MMC/SD | Memory Stick |
|---|---|---|---|---|
| 1 | Ground | Ground | Ground | Ground |
| 2 | D3 | D3 | — | — |
| 3 | D4 | D4 | — | — |
| 4 | D5 | D5 | — | — |
| 5 | D6 | D6 | — | — |
| 6 | D7 | D7 | — | — |
| 7 | -CE1 | -SMCS | — | — |
| 8 | A10 | — | — | — |
| 9 | -OE | -OE | — | — |
| 10 | A9 | — | — | — |
| 11 | A8 | — | — | — |
| 12 | A7 | — | — | — |
| 13 | Power | Power | Power | Power |
| 14 | A6 | CLE | | |
| 15 | A5 | ALE | | |
| 16 | A4 | READY | | |
| 17 | A3 | -WP | | |
| 18 | A2 | LVD | SCLK | SCLK |
| 19 | A1 | | DAT | DAT |
| 20 | A0 | | CMD | CMD |
| 21 | D0 | D0 | | |
| 22 | D1 | D1 | | |
| 23 | D2 | D2 | | |
| 24 | — | — | — | — |
| 25 | -CD2 | -CD2 | -CD2 | -CD2 |
| 26 | -CD1 | -CD1 | -CD1 | -CD1 |
| 27 | D11 | — | — | — |
| 28 | D12 | — | — | — |
| 29 | D13 | — | — | — |
| 30 | D14 | — | — | — |
| 31 | D15 | — | — | — |
| 32 | -CE2 | — | — | — |
| 33 | — | — | — | — |
| 34 | tie high | — | — | — |
| 35 | tie high | — | — | — |
| 36 | -WE | -WE | — | — |
| 37 | INTRQ | — | — | — |
| 38 | Power | Power | Power | Power |
| 39 | — | — | — | — |
| 40 | — | — | — | — |
| 41 | RESET | — | — | — |
| 42 | — | — | — | — |
| 43 | — | — | — | — |
| 44 | -REG | — | — | — |
| 45 | — | — | — | — |
| 46 | — | — | — | — |
| 47 | D8 | — | — | — |
| 48 | D9 | — | — | — |
| 49 | D10 | — | — | — |
| 50 | Ground | Ground | Ground | Ground |

FIG. 5

FLASHTOASTER FOR READING SEVERAL TYPES OF FLASH-MEMORY CARDS, WITH OR WITHOUT A PC

CROSS-REFERENCE TO RELATED APPLICATIONS

This application is a continuation of U.S. patent application Ser. No. 10/167,925 filed on Jun. 11, 2002, entitled "Flashtoaster for Reading Several Types of Flash-Memory Cards With or Without a PC," which is a continuation of U.S. patent application Ser. No. 09/610,904 filed on Jul. 6, 2000, now U.S. Pat. No. 6,438,638, entitled "Flashtoaster for Reading Several Types of Flash-Memory Cards With or Without a PC."

FIELD OF THE INVENTION

This invention relates to flash-memory readers, and more particularly for interfacing several different types of flash-memory cards to a personal computer.

BACKGROUND OF THE INVENTION

Digital cameras have become one of the most popular of electronic devices. In a recent year, more digital cameras were sold than traditional film cameras. Images from digital cameras can be downloaded and stored on personal computers. Digital pictures can be converted to common formats such as JPEG and sent as e-mail attachments or posted to virtual photo albums on the Internet. Video as well as still images can be captured, depending on the kind of digital camera.

Digital cameras typically capture images electronically and ultimately store the images as bits (ones and zeros) on a solid-state memory. Flash memory is the most common storage for digital cameras. Flash memory contains one or more electrically-erasable read-only-memory (EEPROM) integrated circuit chips that allow reading, writing, and block erasing.

Early digital cameras required the user to download or transfer the images from the flash memory within the digital camera to a personal computer (PC). A standard serial cable was most widely used. However, the limited transfer rate of the serial cable and the large size of the digital images made such serial downloads a patience-building experience. Serial downloads could easily take half an hour for only a few dozen images.

Digital camera manufacturers solved this problem by placing the flash memory chips on a small removable card. The flash-memory card could then be removed from the digital camera, much as film is removed from a standard camera. The flash-memory card could then be inserted into an appropriate slot in a PC, and the image files directly copied to the PC.

FIG. 1A shows a flash memory card and adapter for transferring images from a digital camera to a PC. A user takes pictures with digital camera 14 that are stored in image files on flash memory chip(s). The flash memory chip is contained in CompactFlash card 16, which can be removed from digital camera 14 by pressing a card-eject button. Thus Compact-Flash card 16 contains the image files.

While some smaller hand-held computers or personal-digital-assistants (PDA) have slots that receive CompactFlash cards, most PC's do not. Laptop or notebook PC's have PC-card (earlier known as PCMCIA, Personal Computer Memory Card International Association) slots that can receive PCMCIA cards. Many functions have been placed on PCMCIA cards, such as modems, Ethernet, flash memory, encryption keys, and even miniature hard drives.

CF-to-PCMCIA adapter 10 is a passive adapter that contains an opening that receives CompactFlash card 16. FIG. 1B shows CF-to-PCMCIA adapter 10 with CompactFlash card 16 inserted. Such CF-to-PCMCIA adapters 10 sell for as little as $5-10. CompactFlash is a trademark of SanDisk Corp. of Sunnyvale, Calif.

FIG. 1C shows a PC connected to a PCMCIA reader. Most laptop and notebook PC's contain one or two PCMCIA slots 22 that CF-to-PCMCIA adapter 10 can fit into. Then the user merely has to copy the image files from CompactFlash card 16 to the hard disk of PC 20. Since high-speed parallel buses are used, transfer is rapid, about the same speed as accessing the hard disk. Thus a half-hour serial-cable transfer can be reduced to less than a minute with the $5 CF-to-PCMCIA adapter.

Desktop PC's usually do not have PCMCIA slots. Then PCMCIA reader 12 can be used. PCMCIA reader 12 accepts CF-to-PCMCIA adapter 10 and connects to PC 20 through a parallel or high-speed Universal Serial Bus (USB) cable.

Multiple Flash-Card Formats

Although the CompactFlash card format is relatively small, being not much more than an inch square, other smaller cards have recently emerged. FIG. 2A illustrates various formats of flash-memory cards used with digital cameras. Many digital cameras still use CompactFlash card 16, which can be inserted into CF-to-PCMCIA adapter 10 for transfer to a PC. Other smaller, thinner formats have emerged and are used with some manufacturer's digital cameras. For example, SmartMedia card 24 is less than half an inch long, yet has enough flash memory capacity for dozens of images. Smart-Media-to-PCMCIA adapter 10' is available commercially for about $60. The higher cost is believed to be due to a converter chip within adapter 10'. Also, different adapters 10' are required for different memory capacities of SmartMedia card 24. SmartMedia is a trademark of the SSFDC Forum of Tokyo, Japan.

Other kinds of flash-memory cards that are being championed by different manufacturers include MultiMediaCard (MMC) 28 and the related Secure Digital Card (SD) 26. MMC is a trademark of SanDisk Corp. of Sunnyvale, Calif. while SD is controlled by the SD Group that includes Matsushita Electric Industrial Co., SanDisk Corporation, Toshiba Corp. Another emerging form factor from SONY is Memory Stick 18. Memory Stick has a PCMCIA/Floppy adapter while MMC has a floppy adapter.

The different physical shapes and pin arrangements of cards 24, 26, 28 and Memory Stick 18 prevent their use in CF-to-PCMCIA adapter 10. Indeed, most of these cards 24, 26, 28 have less than a dozen pins, while CompactFlash card 16 has a larger 50-pin interface. Furthermore, serial data interfaces are used in the smaller cards 24, 26, 28 while a parallel data bus is used with CompactFlash card 16.

FIG. 2B shows a Memory Stick-to-PCMCIA adapter using an active converter chip. Memory Stick 18 fits into an opening in Memory Stick-to-PCMCIA adapter 15, allowing adapter 15 and the Memory Stick to be plugged into a standard PCMCIA slot on a PC. However, adapter 15 has an integrated circuit (IC) converter chip 11 within it. Converter chip 11 may be needed to convert the serial data format of Memory Stick 18 to the parallel data format of a 68-pin PCMCIA slot. Inclusion of converter chip 11 in adapter 15 significantly increases the cost and complexity of adapter 15 compared to CF-to-PCMCIA adapter 10 which is a passive adapter without a converter chip.

While the advances in flash-memory card technology are useful, the many different cards formats present a confusing array of interface requirements to a PC. Different adapters are needed for each of the card formats. PCMCIA card reader 12 can be replaced with other format readers, such as a Smart-Media Card reader, and even some multi-standard readers are available, such as a universal reader from Lexar Media that reads CompactFlash or SmartMedia in addition to PCMCIA.

What is desired is a universal adapter for flash-memory cards of several different formats. An adapter that accepts SmartMedia, MultiMediaCard, Secure Digital, and Memory Stick cards is desired. A flash-card reader with a single slot that accepts any format card using the adapter is desired. Special detection logic on the flash reader is desired to distinguish between the many flash-card formats is desirable. A low-cost passive adapter is desired that does not need an expensive converter chip. A multi-format reader is desired for a PC. A stand-alone flash reader is desired that can copy image files from flash cards without a PC is also desired.

SUMMARY OF THE INVENTION

A single-slot multi-flash-card reader has a personal computer interface for transferring data to a personal computer. A converter means is coupled to the personal computer interface. It converts multiple flash-card interfaces to a format used by the personal computer interface. The multiple flash-card interfaces include a CompactFlash interface and smaller interfaces having fewer pins that the CompactFlash interface.

A CompactFlash connector is coupled to the converter means. It receives a CompactFlash card through a single slot in the single-slot multi-flash-card reader. The CompactFlash connector makes electrical connection with the Compact-Flash card for signals in the CompactFlash interface.

An adapter has a physical shape to removably insert into the CompactFlash connector. The adapter has a mating Compact-Flash connector that fits the CompactFlash connector. The adapter also has a smaller connector. The smaller connector fits to other flash-memory cards having the smaller interfaces.

A wiring means in the adapter connects between the smaller connector and the mating CompactFlash connector. It directly connects signals from the smaller connector in the smaller interface with signals in the mating CompactFlash connector. Thus the adapter allows the other flash-memory cards having the smaller interfaces to fit into the Compact-Flash connector through the single slot to be read by the converter means.

In further aspects the wiring means connects card select signals from all of the smaller interfaces to card select signals in the CompactFlash connector. The converter means includes a card-detect means that is coupled to sense the card select signals. It detects presence of a flash-memory card inserted into the CompactFlash connector. Thus the converter means detects presence of CompactFlash and the other flash-memory cards having the smaller interfaces.

BRIEF DESCRIPTION OF THE DRAWINGS

FIG. 5 is a table of pin mappings for the SmartMedia, MMC/SD, and Memory Stick to CompactFlash adapters.

DETAILED DESCRIPTION

The present invention relates to an improvement in flash-memory card readers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a universal adapter can be constructed using the CompactFlash card form factor. A reader that reads CompactFlash cards can then read any of the other flash-memory cards that plug into the CompactFlash adapter. The adapters are simple, inexpensive passive adapters without a conversion chip.

The inventors have found a pin mapping from the smaller flash-card formats to CompactFlash that allows for easy detection of the type of flash-memory card inserted into the adapter. Detection of the type of flash-memory card is thus performed automatically by electronic detection by the CompactFlash reader. The CompactFlash reader is modified to perform this card-type detection. Signal conversion such as serial-to-parallel is performed by the CompactFlash reader rather than by the adapter. Adapter costs are reduced while CompactFlash reader cost is increased only slightly. The CompactFlash reader can use a single CompactFlash slot to read multiple flash-card types, including SmartMedia, MultiMediaCard, Secure Digital, Memory Stick, and Compact-Flash.

In another embodiment, the CompactFlash reader is somewhat larger, and has multiple slots. The adapter is not needed in this embodiment. Instead, a slot is provided for each of the flash-memory card formats—SmartMedia, MultiMediaCard, Secure Digital, Memory Stick, and CompactFlash. A PCMCIA can also be added. This CompactFlash reader can be connected to the PC by a USB cable, or it can be located within the PC chassis.

In a third embodiment, the CompactFlash reader is a standalone device that can operate without a PC. A removable disk media such as a R/W CD-ROM is included. Images from the flash-memory card are copied to the removable disk media by the CompactFlash reader. A simple interface is used, such as having the user presses a button to initiate image transfer.

Figure 1A:
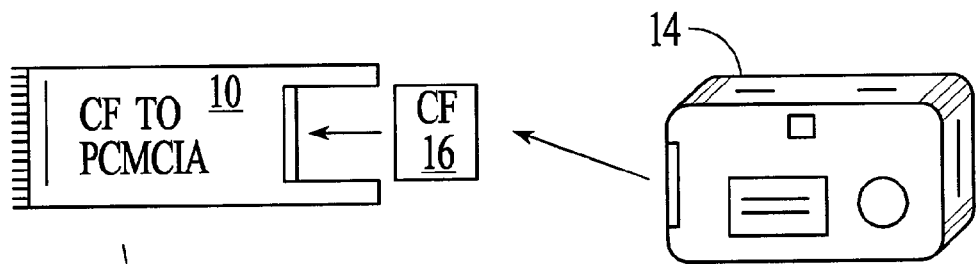
FIG. 1A shows a flash memory card and adapter for transferring images from a digital camera to a PC.
Figure 1B:
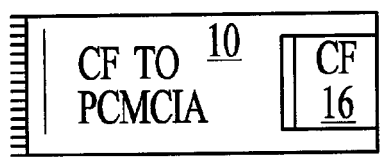
FIG. 1B shows CF-to-PCMCIA adapter 10 with Compact-Flash card 16 inserted.
Figure 1C:
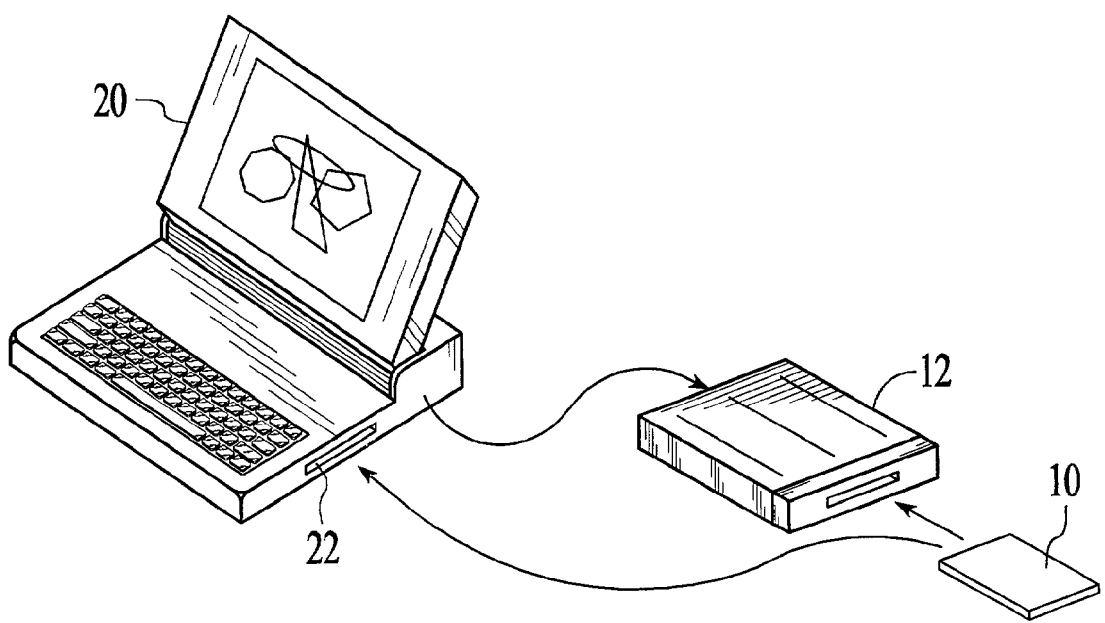
FIG. 1C shows a PC connected to a PCMCIA reader.
Figure 2A:
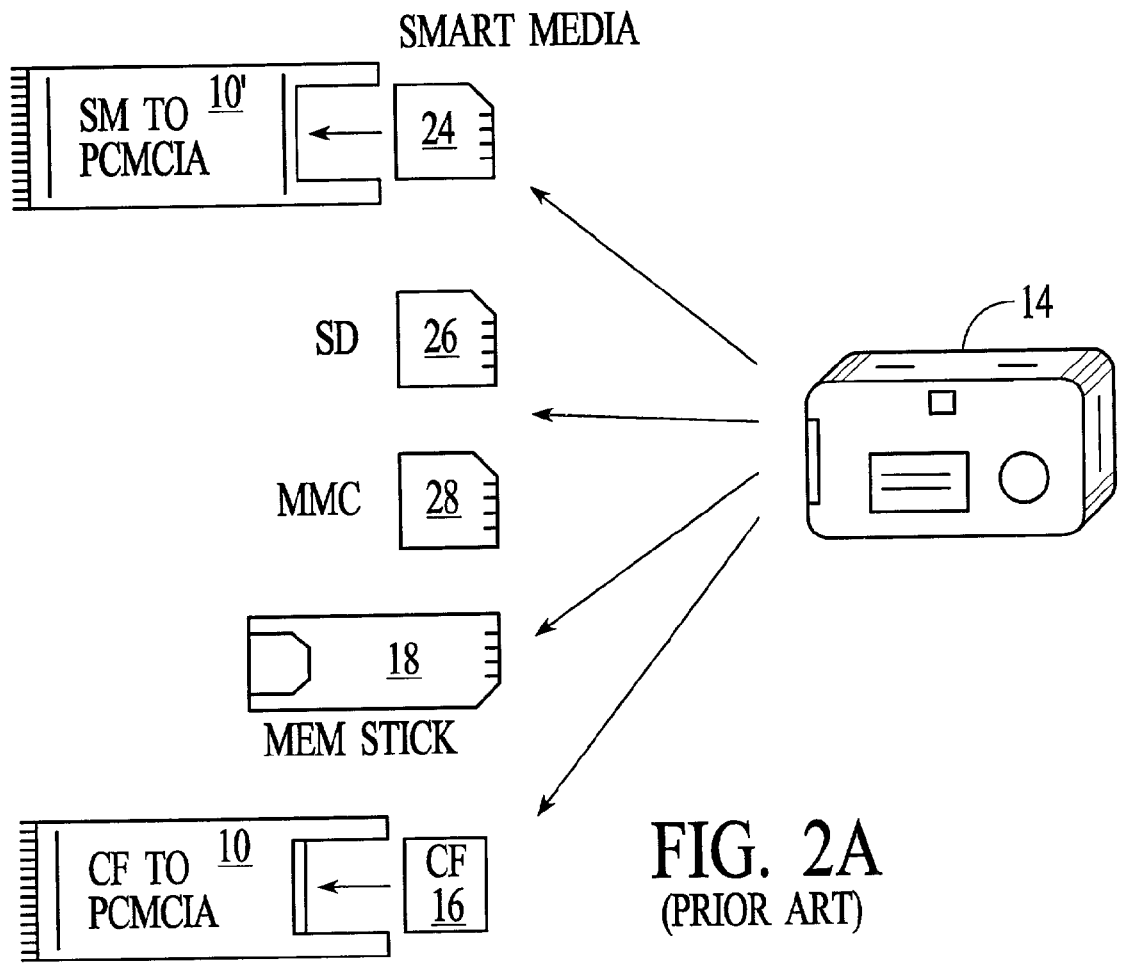
FIG. 2A illustrates various formats of flash-memory cards used with digital cameras.
Figure 2B:
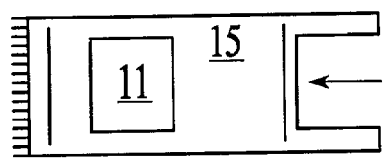
FIG. 2B shows a Memory Stick-to-PCMCIA adapter using an active converter chip.
Figure 3A:
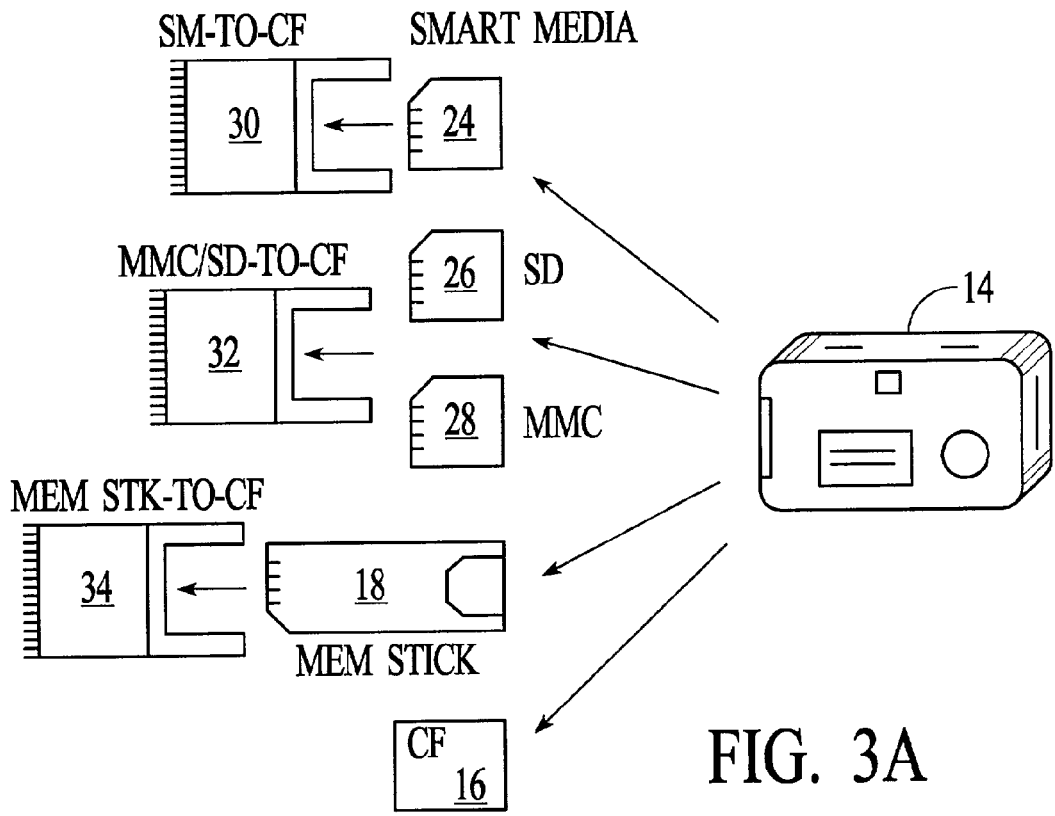
FIG. 3A shows a universal CompactFlash adapter that accepts SmartMedia, MultiMediaCard, Secure Digital, and Memory Stick flash-memory cards.
Figure 3B:
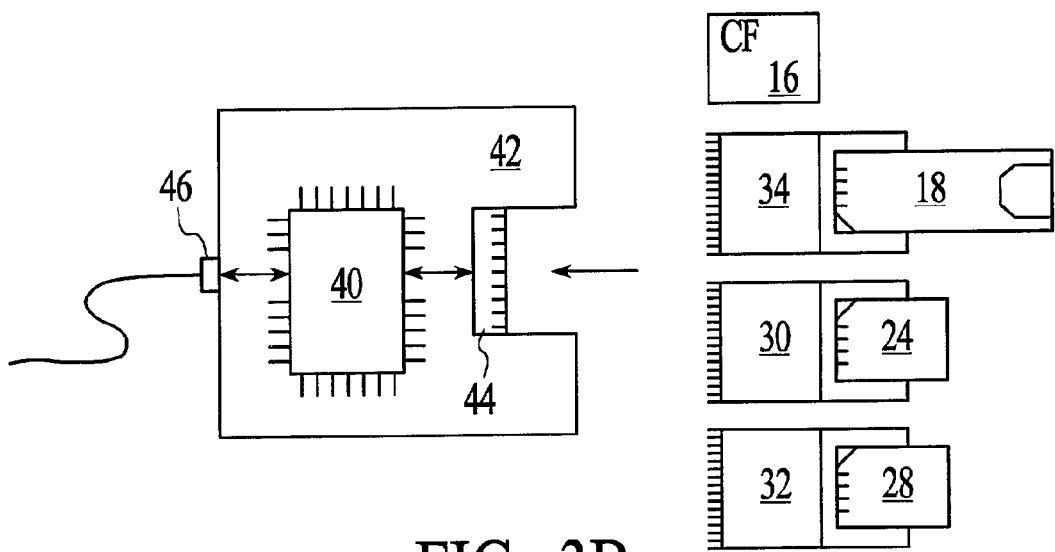
FIG. 3B shows a CompactFlash reader that reads Smart-Media, MultiMediaCard, Secure Digital, and Memory Stick flash-memory cards through passive adapters to the Compact-Flash form factor.

Universal, Passive Adapters—FIGS. 3A-B

FIG. 3A shows a universal CompactFlash adapter that accepts SmartMedia, MultiMediaCard, Secure Digital, and Memory Stick flash-memory cards. Digital camera 14 stores images on flash memory that is in one of several card types. CompactFlash card 16 uses a 50-pin connector and transfers image data in a 16-bit parallel format.

SmartMedia card 24 is smaller flash-memory card with a 22-pin interface and transfers data in an 8-bit parallel format. SmartMedia adapter 30 converts the 22-pin SmartMedia interface to fit within the 50-pin CompactFlash interface. When SmartMedia card 24 is plugged into SmartMedia adapter 30, both can be plugged into a CompactFlash slot on a CompactFlash reader. Of course, ordinary CompactFlash readers will not be able to read SmartMedia card 24 since special signal conversion is required by the CompactFlash reader.

MultiMediaCard 28 and Secure Digital card 26 are flash-memory cards with similar 9-pin interfaces. Serial data transfer is used through a single Data I/O pin. MMC/SD adapter 32 has an opening with a 9-pin connector to receive either MultiMediaCard 28 or Secure Digital card 26. Once MultiMediaCard 28 or Secure Digital card 26 is inserted into MMC/SD adapter 32, then MMC/SD adapter 32 can be inserted into a CompactFlash slot on a special CompactFlash reader. The CompactFlash reader then detects the card type and performs serial-to-parallel conversion.

Memory Stick 18 is also a flash-memory card with a 9-pin, serial-data interface, but is narrower and longer than MultiMediaCard 28 or Secure Digital card 26. Memory Stick adapter 34 has an opening with a 10-pin connector to receive Memory Stick 18. Once Memory Stick 18 is inserted, Memory Stick adapter 32 can itself be inserted into a CompactFlash slot on a special CompactFlash reader. The CompactFlash reader then detects the card type and performs serial-to-parallel conversion.

FIG. 3B shows a CompactFlash reader that reads SmartMedia, MultiMediaCard, Secure Digital, and Memory Stick flash-memory cards through passive adapters to the CompactFlash form factor. CompactFlash reader 42 has an opening or slot with 50-pin connector 44 that accepts CompactFlash card 16. Controller chip 40 performs handshaking with CompactFlash card 16 and performs data transfer. CompactFlash reader 42 also connects to a PC over USB connector 46. Controller chip 40 also controls the USB interface to the host PC, allowing image files to be transferred to the PC from CompactFlash card 16.

Other kinds of flash-memory cards can also be read by CompactFlash reader 42. For example, adapter 34 allows Memory Stick 18 to be read. Memory Stick adapter 34 has an opening that Memory Stick 18 fits into, while Memory Stick adapter 34 itself fits into 50-pin connector 44, since adapter 34 has the same form factor as a CompactFlash card.

SmartMedia card 24 can also be read by CompactFlash reader 42, using SmartMedia adapter 30. Likewise, MultiMediaCard 28 or Secure Digital card 28 can be read using MMC/SD adapter 32.

Adapters 30, 32, 34 are passive adapters that only connect pins from the smaller flash-memory cards to the 50-pin CompactFlash connector. An active converter chip is not required, greatly reducing cost and complexity.

Detection of Card Type—FIGS. 4A-E

FIGS. 4A-E detail detection of the type of flash-memory card by the CompactFlash reader. Since the same CompactFlash slot is used for many kinds of flash-memory cards, a detection method is useful so that the user doesn't have to explicitly indicate what type of flash-memory card is inserted into the CompactFlash reader.

The inventors have carefully examined the pins of the interfaces to the various flash-memory cards and have discovered that type-detection can be performed by examining two address pins. Address pins A0 and A1 are the least-significant-bits (LSB) of the address of the 50-pin CompactFlash interface. These pins are normally inputs to the CompactFlash card and thus are driven by the CompactFlash reader. When the reader does not drive A0, A1 to the inserted CompactFlash card, the A0, A1 pins float or are pulled high by pullup resistors.

Address pins are not present on the other kinds of flash-memory cards. Instead, the address and data are multiplexed. For MMC/SD and Memory Stick, the address is sent serially. Using the adapters, pins from the other flash-memory cards can be connected to the CompactFlash pins. Pins A0 and A1 are used to detect the type of card. For SmartMedia, the addresses are sent by using a special control sequence followed by 3 or 4 bytes of starting address.

Figure 4A:
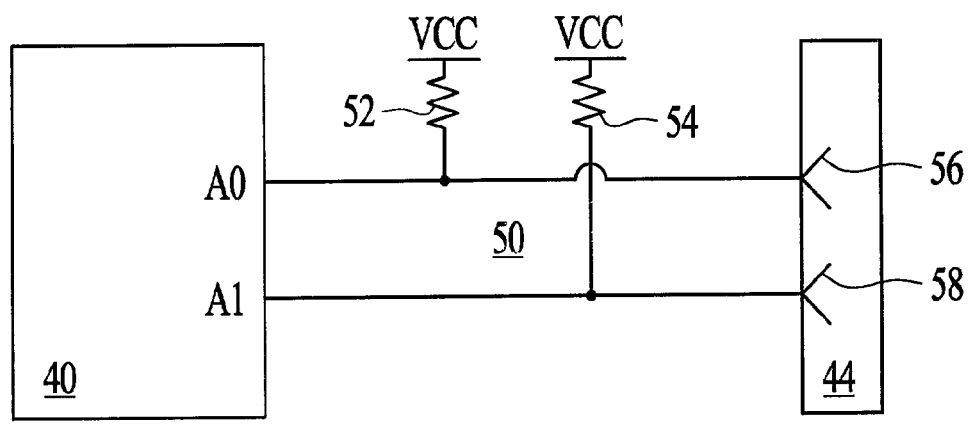
FIGS. 4A-E show card-type detection using the A1, A0 pins of the CompactFlash reader interface.

In FIG. 4A, the A1, A0 pins of the CompactFlash reader interface are highlighted. Converter chip 40 in the CompactFlash reader normally drives all 11 address pins in the CompactFlash interface when reading a CompactFlash card plugged into connector 44. The A0 pin from the CompactFlash card plugs into connector cup 56, while the A1 pin from the CompactFlash card plugs into connector cup 58 of 50-pin connector 44.

Card-type detector 50 has two pullup resistors added to lines A0, A1. Resistor 52 pulls line A0 high to power (Vcc) when neither converter chip 40 nor a card plugged into connector 44 drives line A0. Likewise, resistor 54 pulls line A1 high when line A1 is not being actively driven. During detection mode, converter chip 40 is programmed to not drive lines A0, A1 and instead use then as inputs to the detector logic.

Figure 4B:
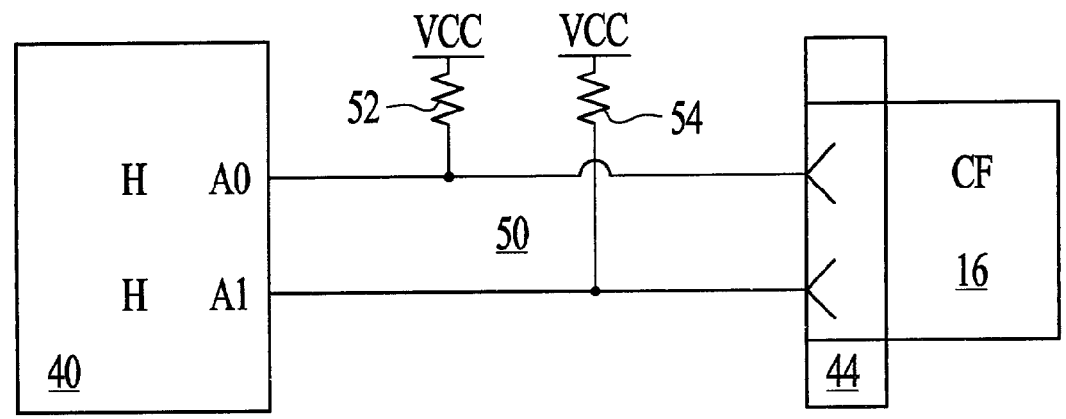

In FIG. 4B, a CompactFlash card is inserted into the connector for card-type detection. CompactFlash card 16 is plugged into connector 44. Since A0 and A1 are inputs to CompactFlash card 16, they are not driven by CompactFlash card 16. During detection mode, converter chip 40 also does not drive pins A0, A1. Thus lines A0, A1 are left floating and are each pulled high by resistors 52, 54.

Detection logic in converter chip 40 reads card-select pins CD0, CD1 to detect the presence of a flash-memory card. When a new card is present, detection logic then reads pins A0, A1 as inputs. Both inputs are high. The detection logic in converter chip 40 recognizes the HH state of A0, A1 as indicating that a CompactFlash card is plugged into connector 44. Converter chip 40 then exits detection mode and configures its interface to connector 44 for the 50-pin CompactFlash interface as shown later in FIG. 5.

Figure 4C:
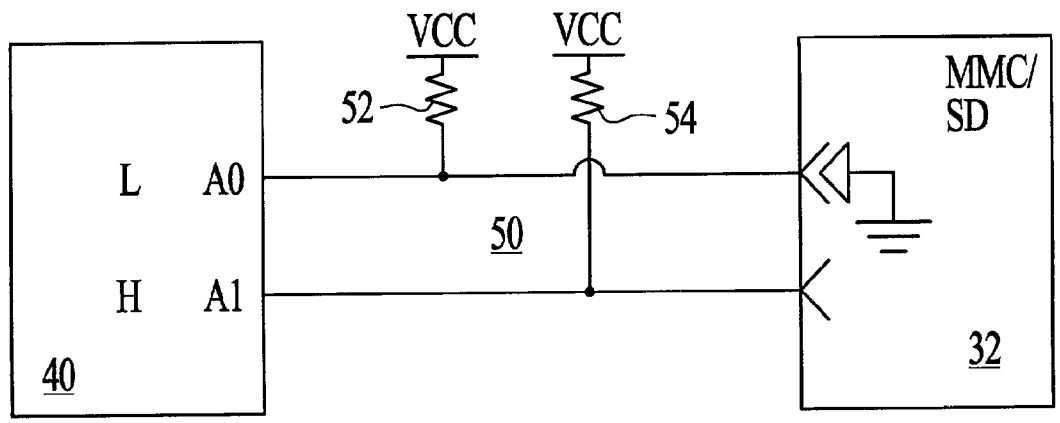

In FIG. 4C, a MultiMediaCard or Secure Digital card is inserted into the connector for card-type detection. MMC/SD card 28 (not shown) is plugged into MMC/SD adapter 32 which is plugged into connector 44.

Converter chip 40 does not drive pins A1, A0 during detection mode. Thus pin A1 floats and is pulled high by resistor 54. The A0 pin is driven low by the MMC card.

Detection logic in converter chip 40 reads card-select pins CD0, CD1 to detect the presence of a flash-memory card. When a new card is present, detection logic then reads pins A0, A1 as inputs. While A0 is low, A1 is high. The detection logic in converter chip 40 recognizes the LH state of A0, A1 as indicating that a MMC or SD card is plugged into connector 44. Converter chip 40 then exits detection mode and configures its interface to connector 44 for the 9-pin MMC/SD interface as shown later in FIG. 5.

Figure 4D:
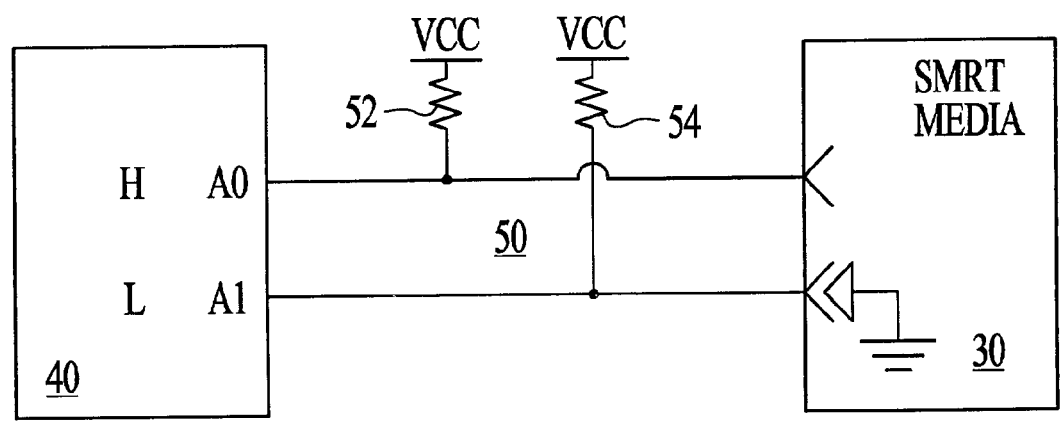

In FIG. 4D, a SmartMedia card is inserted into the connector for card-type detection. SmartMedia card 24 (not shown) is plugged into SmartMedia adapter 30 which is plugged into connector 44. The adapter 30 does not connect pins A0, A1 from the CompactFlash interface to any pins on the SmartMedia card. Adapter 30 internally connects pin A1 from the CompactFlash interface to the ground pin on the CompactFlash interface.

The SmartMedia card does not drive either pin A1, A0, although adapter 30 drives pin A1 low. Likewise, converter chip 40 does not drive pins A1, A0 during detection mode. Pin A0 floats and is pulled high by resistor 52.

Detection logic in converter chip 40 reads card-select pins CD0, CD1 to detect the presence of a flash-memory card. When a new card is present, detection logic then reads pins A0, A1 as inputs. While A0 is high, A1 is low. The detection logic in converter chip 40 recognizes the HL state of A0, A1 as indicating that a SmartMedia card is plugged into connector 44. Converter chip 40 then exits detection mode and configures its interface to connector 44 for the 22-pin SmartMedia interface as shown later in FIG. 5.

Figure 4E:
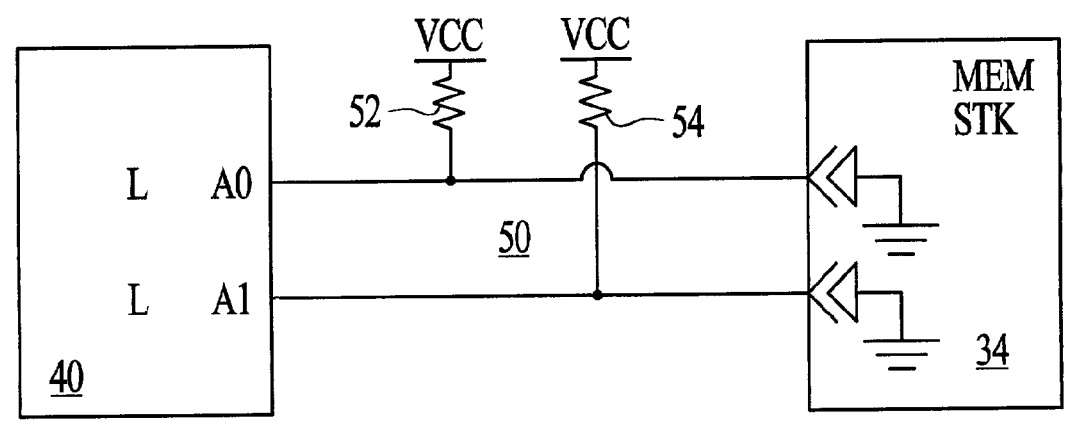

In FIG. 4E, a Memory Stick card is inserted into the connector for card-type detection. Memory Stick card 18 (not shown) is plugged into Memory Stick adapter 34 which is plugged into connector 44.

Detection logic in converter chip 40 reads card-select pins CD0, CD1 to detect the presence of a flash-memory card. When a new card is present, detection logic then reads pins A0, A1 as inputs. Both pins A0, A1 are low. The detection logic in converter chip 40 recognizes the LL state of A0, A1 as indicating that a Memory Stick card is plugged into connector 44.

Pin Mapping—FIG. 5

FIG. 5 is a table of pin mappings for the SmartMedia, MMC/SD, and Memory Stick to CompactFlash adapters. The pin numbers for the smaller interfaces for SmartMedia, MMC/SD, and Memory Stick are not shown but can be in any order or designation. The adapter connects the proper pin on the smaller interface to the CompactFlash pin number shown in FIG. 5. Simple wiring such as individual wires, flat cables, printed-circuit board (PCB), or wiring traces can be used.

The ground pins on the smaller interfaces are connected to CompactFlash pins 1 and 50. Power pins are connected to CompactFlash pins 13, 38. Pins 25, 26 are the card detect signals for CompactFlash, which the adapters connect to the card-detect signals on all smaller interfaces.

The CompactFlash connectors use pins 2-6, 21-23, 27-31, and 47-49 for the 16-bit parallel data bus to the CompactFlash card. Pins 8, 10-12, and 14-20 form a separate 11-bit address bus. The separate data and address buses provide for rapid random addressing of CompactFlash cards. Other control signals include pins 6, 32 chip enables, pin 9 output enable, pin 36 write enable, interrupt pin 37, reset pin 41, and register REG pin 44. REG pin 44 is the Attribute Memory Select, defined based on the CF mode of operation, i.e. PCMCIA I/O mode, IDE or PCMCIA Memory Mode. Several pins in the 50-pin interface are not connected.

The smaller SmartMedia interface also has a parallel data bus of 8 bits. These are mapped to pins 2-6, and 21-23 of the CompactFlash interface to match the CompactFlash DO:7 signals. While no separate address bus is provided, address and data are multiplexed. Control signals for latch enables, write enable and protect, output enable, and ready handshake are among the control signals. Output enable-OE and write enable-WE are mapped to the same function pins 9, 36 of the CompactFlash interface. The total number of pins in the SmartMedia interface is 22.

The Memory Stick and MMC/SD flash-memory-card interfaces are smaller still, since parallel data or address busses are not present. Instead, serial data transfers occur through serial data pin DIO, which is mapped to pin 19 (A1). Data is clocked in synchronization to clock SCLK on pin 18. A command signal CMD or BS occupies pin 20 (A0). The MMC/SD and Memory Stick interfaces require only 6 pins plus power and ground.

Detection logic in converter chip 40 reads card-select pins CD0, CD1 to detect the presence of a flash-memory card. When a new card is present, detection logic then reads pins A0, A1 as inputs to determine the card type. The pullup resistors of FIG. 4A together with wiring inside the adapter and the card's behavior determines whether A0, A1 are pulled low by the adapter or pulled high by the pullup resistors.

Figure 6:
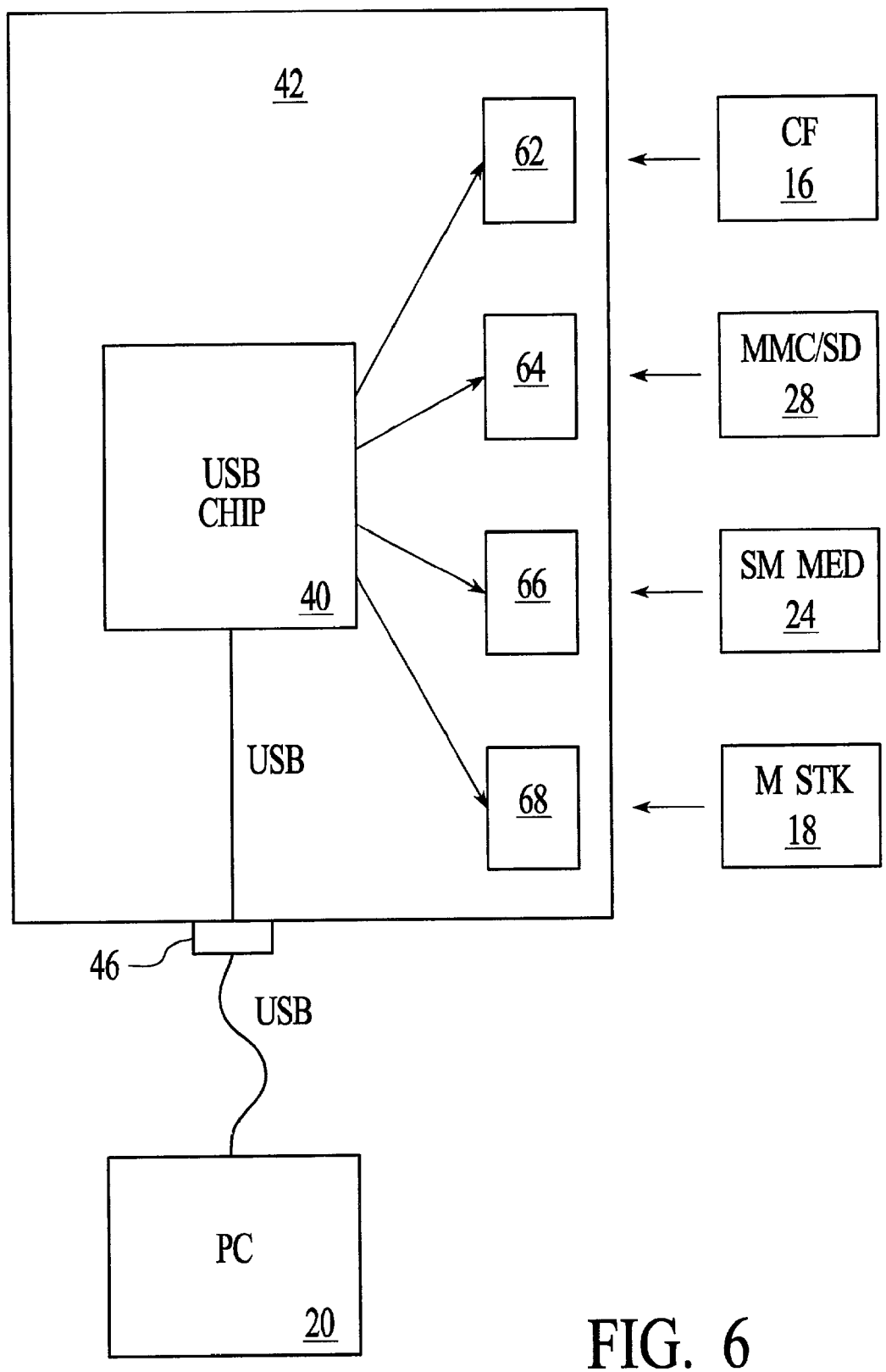
FIG. 6 is a diagram of a multi-slot embodiment of the flash-card reader.

Multi-Slot Multi-Flash-Card Reader—FIG. 6

FIG. 6 is a diagram of a multi-slot embodiment of the flash-card reader. While the single-slot embodiment of FIG. 3B results in the smallest physical design, somewhat larger flash-card readers can be made that have separate slots for each type of flash-memory card, rather than a single slot. This negates the need for the adapters.

Four connectors are provided in flash reader 42: a 50-pin CompactFlash connector 62 that fits CompactFlash card 16, a 9 pin MMC/SD connector 64 that fits MultiMediaCard 28 or a Secure Digital card, a 22-pin SmartMedia connector 66 that fits SmartMedia card 24, and a 10-pin Memory Stick connector 68 that fits Memory Stick 18.

Each of the four connectors 62, 64, 66, 68 route their signals to converter chip 40. Converter chip 40 detects when a flash-memory card has been inserted into one of the connectors 62, 64, 66, 68 and configures itself to read files from the inserted card using the pin interface of FIG. 5 corresponding to the card type.

Converter chip 40 executes various routines to perform handshaking with the flash-memory cards and accept data, either serially or in parallel. The data is buffered and then sent to the host PC 20 through USB connector 46. Converter chip 40 generates the appropriate USB-interface signals to transfer the data to host PC 20.

Having separate connectors 62, 64, 66, 68 with separate slots in flash reader 42 allows for card-to-card transfers. For example, images or other files from Memory Stick 18 could be transferred to CompactFlash card 16 by converter chip 40 reading serial data from Memory Stick inserted into connector 68, converting to parallel, and writing to connector 62 and CompactFlash card 16. Each of the flash-memory cards in connectors 62, 64, 66, 68 can be assigned a different drive letter by the operating system, such as e:, f:, g:, and h:.

In this embodiment, flash reader 42 is contained in an external housing that connects to host PC 20 through a USB cable. Of course, other cables and interfaces such as IEEE 1394 FireWire may be substituted.

Figure 7:
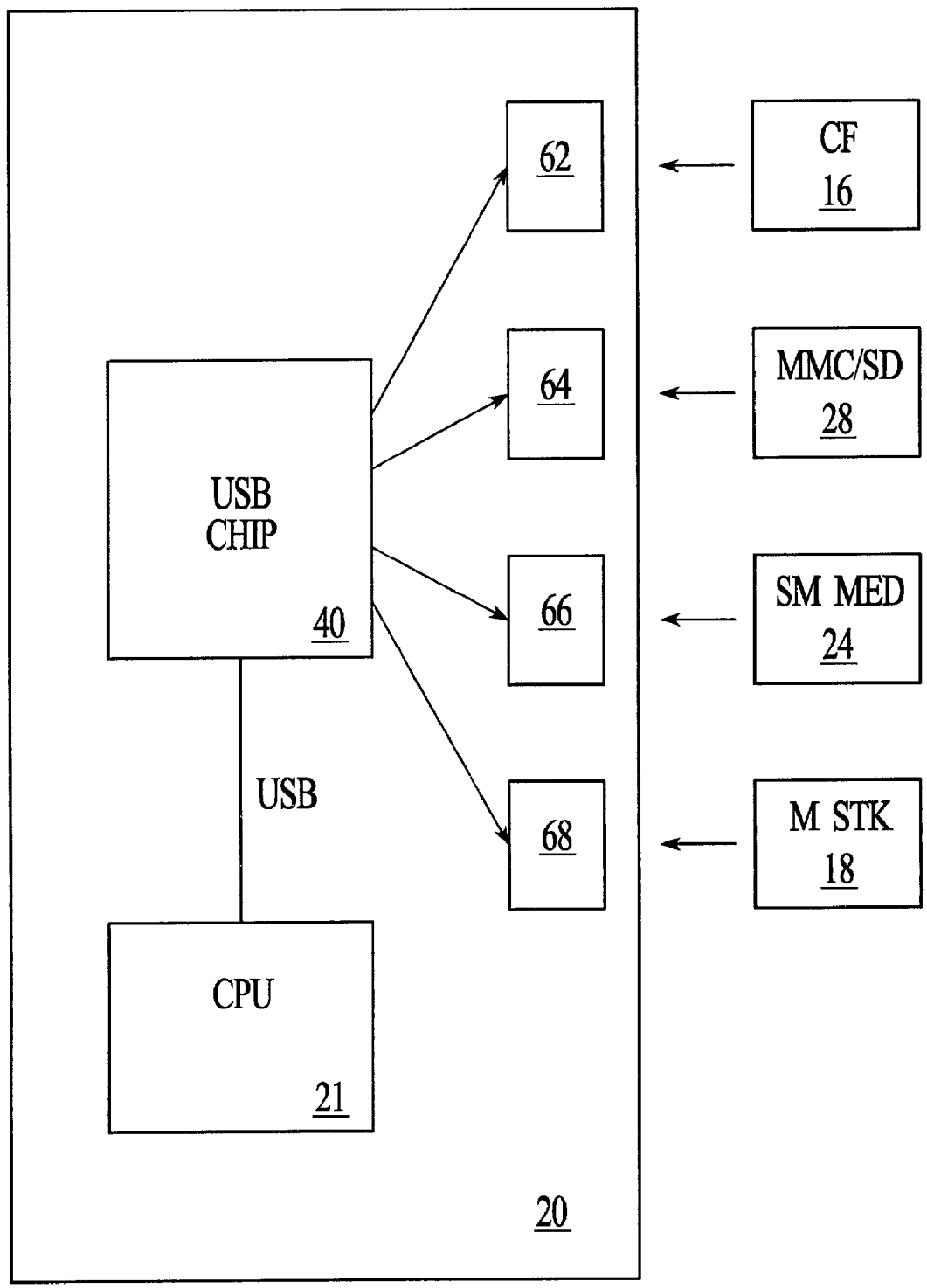
FIG. 7 shows a flash-memory reader within a PC.

Flash Reader within PC—FIG. 7

FIG. 7 shows a flash-memory reader within a PC. Four slots and four connectors are provided in flash reader 42. A 50-pin CompactFlash connector 62 fits CompactFlash card 16, a 9-pin MMC/SD connector 64 fits MultiMediaCard 28 or a Secure Digital card, a 22-pin SmartMedia connector 66 fits SmartMedia card 24, and a 10-pin Memory Stick connector 68 fits Memory Stick 18.

Each of the four connectors 62, 64, 66, 68 route their signals to converter chip 40. Converter chip 40 detects when a flash-memory card has been inserted into one of the connectors 62, 64, 66, 68 and configures itself to read files from the inserted card using the pin interface of FIG. 5 corresponding to the card type. Each of the flash-memory cards in connectors 62, 64, 66, 68 can be assigned a different drive letter by the operating system, such as e:, f:, g:, and h:.

Converter chip 40 executes various routines to perform handshaking with the flash-memory cards and accept data, either serially or in parallel. The data is buffered and then sent to the CPU 21 in PC 20 through an internal USB bus. Converter chip 40 generates the appropriate USB-interface signals to transfer the data to CPU 21.

Figure 8:
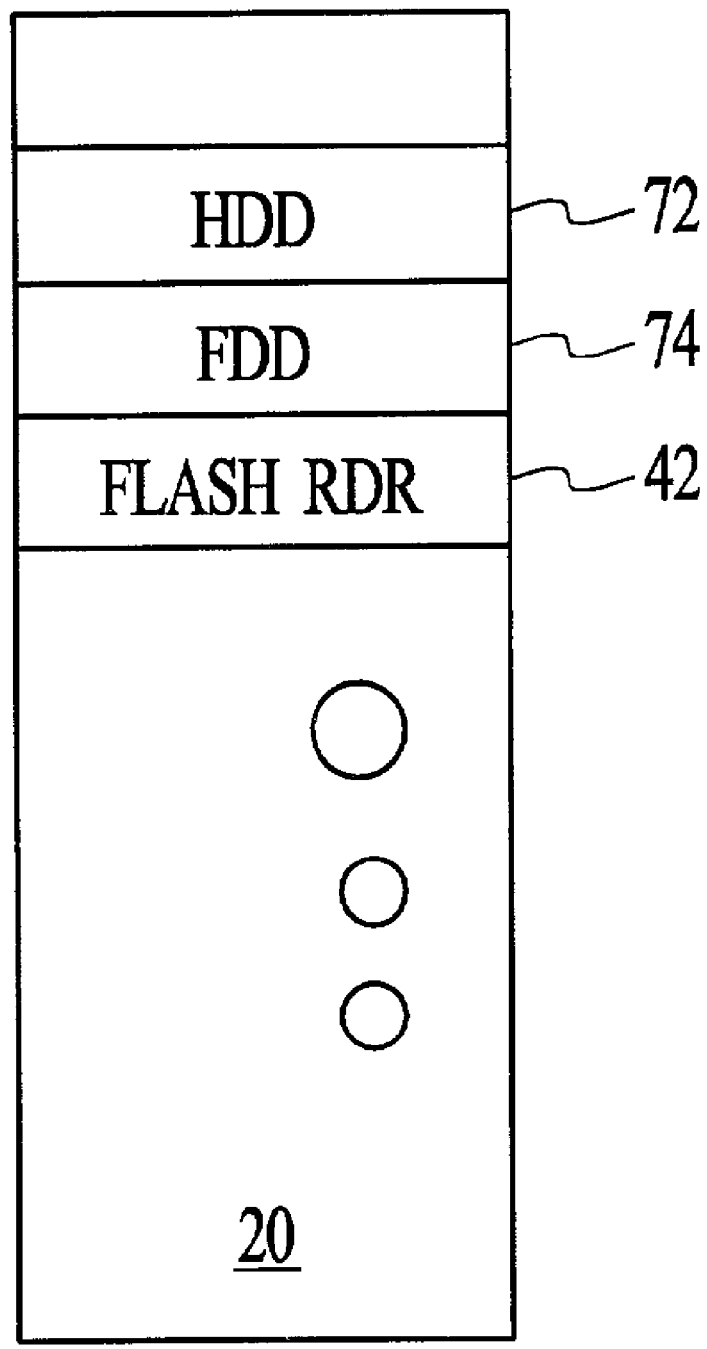
FIG. 8 shows a PC chassis with a flash-card reader in one of the drive bays.

FIG. 8 shows a PC chassis with a flash-card reader in one of the drive bays. PC 20 is enclosed by a chassis or case that has several drive bays allowing the user or manufacturer to insert peripherals such as hard and floppy disk drives, CD-ROM and DVD drives, and tape drives. HDD bay 72 contains a hard-disk drive, while FDD bay 74 contains a floppy disk drive. These are connected by cables to cards inserted into a USB, ATA, or other expansion bus connectors on the motherboard.

Flash reader 42 is inserted into one of the drive bays. The four slots face forward, allowing the user to insert flash-memory cards into flash reader 42 much as a floppy disk is inserted into the floppy-disk drive in FDD bay 74.

Flash reader 42 can be installed by the user from a kit purchased at a store, or it can be pre-installed by an original-equipment manufacturer (OEM) or retailer. The user can easily transfer digital images from a digital camera, regardless of the type of flash-card used by the camera, due to the many different formats of flash-memory cards read by flash reader 42.

Figure 9:
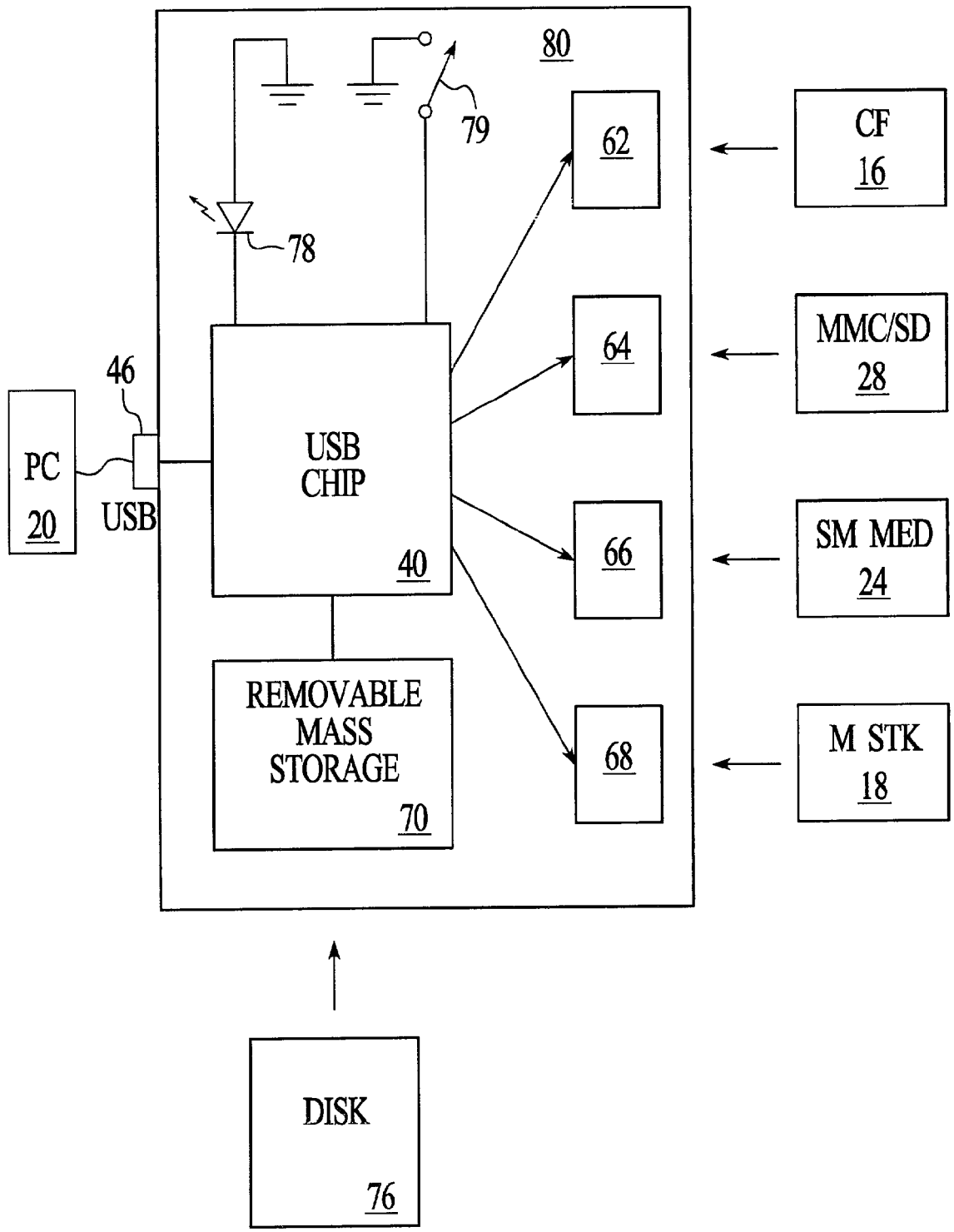
FIG. 9 is a diagram of a stand-alone FlashToaster that accepts several formats of flash-memory cards and can copy images to a removable disk without being connected to a host PC.

FlashToaster—FIG. 9

FIG. 9 is a diagram of a stand-alone FlashToaster that accepts several formats of flash-memory cards and can copy images to a removable disk without being connected to a host PC. Digital photographers may not always have their PC's nearby. While extra flash-memory cards can be purchased and swapped in the digital camera, these flash-memory cards are somewhat expensive, especially when many high-resolution images are captured. Especially during a long trip away from the PC, the user may be limited by the capacity of the flash-memory cards.

FlashToaster 80 has four slots and four connectors are provided in FlashToaster 80. A 50-pin CompactFlash connector 62 fits CompactFlash card 16, a 9-pin MMC/SD connector 64 fits MultiMediaCard 28 or a Secure Digital card, a 22-pin SmartMedia connector 66 fits SmartMedia card 24, and a 10-pin Memory Stick connector 68 fits Memory Stick 18.

Each of the four connectors 62, 64, 66, 68 route their signals to converter chip 40. Converter chip 40 detects when a flash-memory card has been inserted into one of the connectors 62, 64, 66, 68 by sensing card select lines CD0, CD1 and configures itself to read files from the inserted card using the pin interface of FIG. 5 corresponding to the card type.

Converter chip 40 executes various routines to perform handshaking with the flash-memory cards and accept data, either serially or in parallel. The data is buffered and then sent either to host PC 20 through USB connector 46 or to removable mass storage 70. Converter chip 40 generates the appropriate USB-interface signals to transfer the data to host PC 20. Converter chip 40 also generates the control signals for removable mass storage 70, allowing the image data read from the flash-memory card to be written to removable disk 76. Removable disk 76 could be a standard or a high-density floppy diskette, a tape drive, a writeable CD-R/W disk, or other proprietary media such as LS120 by Imation of Oakdale, Minn., or ZIP drives by Iomega Corp. of Roy, Utah.

Each of the flash-memory cards in connectors 62, 64, 66, 68 can be assigned a different drive letter by the operating system, such as e:, f:, g:, and h:. Removable mass storage 70 can also be signed a drive letter.

When FlashToaster 80 is not attached to host PC 20, image files may still be copied to removable mass storage 70. Flash-Toaster 80 may be carried along on a trip by the user, allowing the user to download image files to removable disk 76. Since removable disk 76 ordinarily has a much higher capacity than the flash-memory cards, many pictures may be captured when no access to host PC 20 is available. FlashToaster 80 can be provided with battery power or with its own AC converter.

FlashToaster 80 is provided with a simple user interface, including light-emitting diode LED 78 and button 79. When the user inserts a flash-memory card into one of connectors 62, 64, 66, 68, and removable disk 76 is inserted into removable mass storage 70, the user presses button 79. This activates controller chip 40, which determines which of connectors 62, 64, 66, 68 has a memory card inserted, and copies the image files to removable mass storage 70. LED 78 can be programmed to blink during the copying process, and remain lit when the copying is complete, or vice-versa. This provides a simple visual indication to the user of the copying progress. Errors can be indicated with additional LED indicator lamps, or other blinking arrangements or colors.

Figure 10:
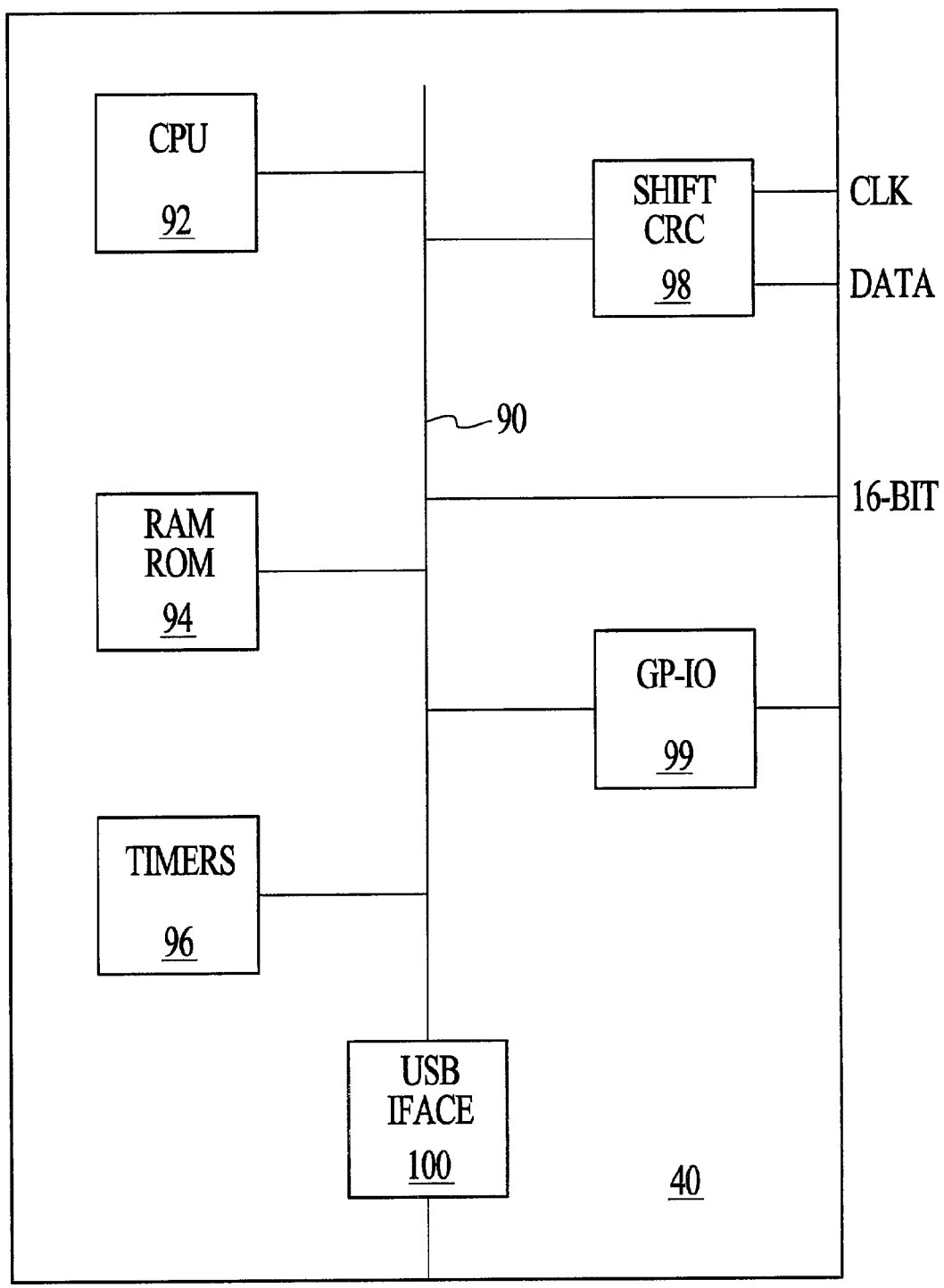
FIG. 10 is a diagram of the converter chip for the flash-memory reader.

Converter Chip—FIG. 10

FIG. 10 is a diagram of the converter chip for the flash-memory reader. Converter chip 40 can be implemented as a commercially-available micro-controller chip that is programmed to read and write I/O pins that are connected to the flash-memory-card connectors and USB interface. Several different control and transfer routines are written and programmed into RAM/ROM 94. CPU 92 then executes these routines. A high-level scanning routine can sense when a flash-memory card is inserted. CPU 92 can then begin execution of another routine specific to that type of flash-memory card. Transfer and handshake sub-routines can then be called.

General-purpose input-output GPIO 99 provides registers or I/O ports that drive external I/O pins of converter chip 40, or read the logic-levels or voltages on input pins to converter chip 40. CPU 92 can read registers in GPIO 99 that are written by control signals that are coupled to I/O pins of converter chip 40 from connectors 62, 64, 66, 68. Control signals to the flash-memory cards can be switched high or low by writing a 1 or a 0 to a register for that control signal in GPIO 99.

Timers 96 are useful for asserting control signals for a required amount of time. For example, a control signal may need to be asserted for a specified number of microseconds. CPU 92 can write a 1 to a register in GPIO 99 and start a timer in timers 96. Timer 6 can sent an interrupt to CPU 96 when the specified time has elapsed, or CPU 92 can continuously or periodically poll timers 96 to determine when the specified time has elapsed. Then CPU 92 can write a 0 to the register in GPIO 99, causing the control signal to transition from 1 to 0.

Shifter 98 is connected to the data and clock signals from connectors 64, 68. When data is reed from the flash-memory card, a clock is pulsed to synchronize the data transfer. Shifter 98 clocks in one bit (serial) or word (parallel) of data for each clock pulse. A cyclical-redundancy-check (CRC) can be performed on the data to detect errors. CPU 92 can request re-transmission of data from the flash-memory card when an error is detected.

Data read by shifter 98 can be sent over internal bus 90 to be stored in a buffer in RAM/ROM 94. Later, CPU 92 can execute a routine to transfer this data from RAM/ROM 94 to USB interface 100. USB interface 100 then transmits the data over an external USB link to a host PC. When a removable mass storage is present, some of the I/O pins from GPIO 99 can connect to the removable mass storage, or a separate disk controller can be included on controller chip 40.

ADVANTAGES OF THE INVENTION

A universal adapter for flash-memory cards accepts cards of several different formats. The adapter accepts SmartMedia, MultiMediaCard, Secure Digital, and Memory Stick cards. The flash-card reader with a single slot accepts any format card using the adapter. Special detection logic on the flash reader distinguishes between the many flash-card formats. The low-cost passive adapter does not need an expensive converter chip. A multi-format reader is ideal for use with a PC. However, a stand-alone flash reader can copy image files from flash cards without a PC. Additionally, preparation of media for use in devices (format and erase operations) can be done using this reader.

A universal adapter is constructed using the CompactFlash card form factor. A reader that reads CompactFlash cards can then read any of the other flash-memory cards that plug into the CompactFlash adapter. The adapters are simple, inexpensive passive adapters without a conversion chip.

The disclosed pin mapping from the smaller flash-card formats to CompactFlash allows for easy detection of the type of flash-memory card inserted into the adapter. Detection of the type of flash-memory card is thus performed automatically by electronic detection by the CompactFlash reader. The CompactFlash reader is modified to perform this card-type detection. Signal conversion such as serial-to-parallel is performed by the CompactFlash reader rather than by the adapter. Adapter costs are reduced while CompactFlash reader cost is increased only slightly. The CompactFlash reader can use a single CompactFlash slot to read multiple flash-card types, including SmartMedia, MultiMediaCard, Secure Digital, Memory Stick, and CompactFlash.

ALTERNATE EMBODIMENTS

Several other embodiments are contemplated by the inventors. Different flash-card formats can be supported such as Smart Cards, and more or less than the four slots shown in the multi-card flash reader can be included. Other adapters can be used for newer flash formats for the single-slot CompactFlash reader. Any device that needs Control Bus, Clock, Data Bus and Address Bus can be designed to fit into this slot. Examples of such devices include (but are not limited to) DSL Modems, Fingerprint security devices, Miniature Hard disks, etc.

While the invention has been described as connecting to a personal computer PC host, the host may also be an Apple computer such as the iMAC or G3. The host may also be a SUN computer, or any host computer using USB or IDE interfaces. The invention can also apply to Personal Digital Assistants (PDAs) such as by Palm Computer or other hand-held appliances, such as a Cell phone with USB capability.

The term "CompactFlash reader" has been used for simplicity, since digital images are often read from the flash-memory card and then written to the PC. However, the CompactFlash reader is capable of reading files from the PC or from another flash-memory card and writing the file to the flash-memory card. Thus the CompactFlash reader is really a reader/writer.

In another embodiment, the CompactFlash reader is somewhat larger, and has multiple slots. The adapter is not needed in this embodiment. Instead, a slot is provided for each of the flash-memory card formats—SmartMedia, MultiMediaCard, Secure Digital, Memory Stick, and CompactFlash. A PCMCIA slot can also be added. This CompactFlash reader can be connected to the PC by a USB cable, or it can be located within the PC chassis.

In a third embodiment, the CompactFlash reader is a stand-alone device that can operate without a PC. A removable disk media such as a R/W CD-ROM is included. Images from the flash-memory card are copied to the removable disk media by the CompactFlash reader. A simple interface is used, such as having the user presses a button to initiate image transfer.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A memory card reader comprising:
a first card slot configured to receive a memory card of a first format having a first size, and the first card slot configured to receive a memory card of a second format having a second size, wherein the second format has a smaller pin count relative to the first format;
a controller coupled to the first card slot, the controller to detect a card of a first format inserted in the first card slot and the controller to read data from the card of the first format, and the controller to detect a card of a second format inserted in the first card slot and the controller to read data from the card of the second format, wherein the controller is to detect an inserted card by reading one or more card select pins of the first card slot, and to identify a format of the card by reading a first address pin and a second address pin.

2. The memory card reader of claim 1, wherein the first card format is a CompactFlash (CF) card.

3. The memory card reader of claim 1, wherein the second card format is one of a group comprising of Multimedia Card (MMC), Secure Digital (SD), and Memory Stick.

4. The memory card reader of claim 3:
wherein the first and second address pins are high when the card format is CF;
wherein the first address pin is low and the second address pin is high when the card format is MMC or SD; and
wherein the first and second address pins are low when the card format is Memory Stick.

5. The memory card reader of claim 1, further comprising:
an adapter to physically adapt the card to interface with the first card slot, when the card is other than the first format.

6. The memory card reader of claim 5, wherein the adapter is a passive adapter.

7. The memory card reader of claim 1, further comprising:
a first pull-up resistor coupled between the first address pin and the controller;
a second pull-up resistor coupled between the second address pin and the controller;

wherein the pull-up resistors drive the address pins high when no pin from the card format is present.

8. A controller comprising:
an interface to communicate with a first card slot to receive a memory card of a first format, and the first card slot to receive a memory card of a second format having a second size, wherein the second format has a smaller pin count relative to the first format;
a unit to detect a card of a first format inserted in the first card slot and to read data from the card of the first format, and to detect a card of a second format inserted in the first card slot and to read data from the card of the second format, wherein the controller is to detect an inserted card by reading one or more card select pins of the first card slot, and to identify the format of the card by reading a first address pin and a second address pin.

9. The controller of claim 8, wherein the first card format is a CompactFlash (CF) card.

10. The controller of claim 8, wherein the second card format is one of a group comprising of Multimedia Card (MMC), Secure Digital (SD), and Memory Stick.

11. The controller of claim 10:
wherein the first and second address pins are high when the card format is CF;
wherein the first address pin is low and the second address pin is high when the card format is MMC or SD; and
wherein the first and second address pins are low when the card format is Memory Stick.

12. The controller of claim 8, wherein the interface is to communicate with an adapter to physically adapt the card to interface with the first card slot, when the card is other than the first format.

13. The controller of claim 12, wherein the adapter is a passive adapter.

14. The controller of claim 8, further comprising:
a first pull-up resistor coupled between the first address pin and the controller;
a second pull-up resistor coupled between the second address pin and the controller;
wherein the pull-up resistors drive the address pins high when no pin from the card format is present.

15. A controller comprising:
an interface to communicate with a first card slot to receive a memory card of a first format, and the first card slot to receive a memory card of a second format having a second size, wherein the second format has a smaller interface relative to the first format;
a unit to detect a card of a first format inserted in the first card slot and to read data from the card of the first format, and to detect a card of a second format inserted in the first card slot and to read data from the card of the second format, wherein the controller is to identify the format of the card by reading a first address pin and a second address pin;
wherein the first and second address pins are high when a card of the first card format is present; and
wherein when a card of the second type is present, the first and second address pins are one of a group comprising: the first address pin is low and the second address pin is high; the first address pin is high and the second address pin is low; and the first and second address pins are low.

16. The controller of claim 15, wherein the first card format is a CompactFlash (CF) card.

17. The controller of claim 15, wherein the second card format is one of a group comprising of Multimedia Card (MMC), Secure Digital (SD), and Memory Stick.

18. The controller of claim 17:
wherein the first and second address pins are high when the card format is CF;
wherein the first address pin is low and the second address pin is high when the card format is MMC or SD; and
wherein the first and second address pins are low when the card format is Memory Stick.

19. A memory card reader comprising:
a first card slot configured to receive a memory card of a first format having a first sizes, and the first card slot to receive a memory card of a second format having a second size, wherein the second format has a smaller pin count relative to the first format;
a controller coupled to the first card slot, the controller to detect a card of a first format inserted in the first card slot and the controller to read data from the card of the first format, and the controller to detect a card of a second format inserted in the first card slot and the controller to read data from the card of the second format, wherein the controller is to detect an inserted card by reading one or more card select pins of the first card slot, and to identify the format of the card by reading a first address pin and a second address pin;
wherein the first and second address pins are high when a card of the first card format is present; and
wherein when a card of the second type is present, the first and second address pins are one of a group comprising: the first address pin is low and the second address pin is high; the first address pin is high and the second address pin is low; and the first and second address pins are low.

20. A controller comprising:
an interface to communicate with a first card slot to receive a memory card of a first format, and the first card slot to receive a memory card of a second format having a second size, wherein the second format has a smaller interface relative to the first format;
a unit to detect a card of a first format inserted in the first card slot and to read data from the card of the first format, and to detect a card of a second format inserted in the first card slot and to read data from the card of the second format, wherein the controller is to detect an inserted card by reading one or more card select pins of the first card slot, and to identify the format of the card by reading a first address pin and a second address pin;
wherein the first and second address pins are high when a card of the first card format is present;
wherein the first address pin is low and the second address pin is high when a first type of card of the second card format is present;
wherein the first address pin is high and the second address pin is low when a second type of card of the second card format is present; and
wherein the first and second address pins are low when a third type of card of the second card format is present.

21. A memory card reader comprising:
a first card slot configured to receive a memory card of a first format having a first size, and the first card slot to receive a memory card of a second format having a second size, wherein the second format has a smaller interface relative to the first format;
a controller coupled to the first card slot, the controller to detect a card of a first format inserted in the first card slot and the controller to read data from the card of the first format, and the controller to detect a card of a second format inserted in the first card slot and the controller to read data from the card of the second format, wherein the controller is to detect an inserted card by reading one or more card select pins of the first card slot, and to identify the format of the card by reading a first address pin and a second address pin;

wherein the first and second address pins are high when a card of the first card format is present;

wherein the first address pin is low and the second address pin is high when a first type of card of the second card format is present;

wherein the first address pin is high and the second address pin is low when a second type of card of the second card format is present; and wherein the first and second address pins are low when a third type of card of the second card format is present.

* * * * *